United States Patent
Akagawa et al.

[11] Patent Number: 5,834,844
[45] Date of Patent: Nov. 10, 1998

[54] SEMICONDUCTOR DEVICE HAVING AN ELEMENT WITH CIRCUIT PATTERN THEREON

[75] Inventors: Masatoshi Akagawa; Mitsutoshi Higashi; Hajime Iizuka; Takehiko Arai, all of Nagano, Japan

[73] Assignee: Shinko Electric Industries Co., Ltd., Nagano, Japan

[21] Appl. No.: 620,290

[22] Filed: Mar. 22, 1996

[30] Foreign Application Priority Data

| Mar. 24, 1995 | [JP] | Japan | 7-065607 |
| Apr. 10, 1995 | [JP] | Japan | 7-083716 |
| Sep. 4, 1995 | [JP] | Japan | 7-226250 |
| Oct. 6, 1995 | [JP] | Japan | 7-259861 |

[51] Int. Cl.$^6$ .......................... H01L 23/10; H01L 23/02; H01L 23/48; H01L 29/40
[52] U.S. Cl. .......................... 257/734; 257/737; 257/738; 257/723; 257/700; 257/781; 257/758
[58] Field of Search .......................... 257/734, 735, 257/737, 738, 723, 700, 741, 749, 758, 762, 766, 772, 777–781, 712

[56] References Cited

U.S. PATENT DOCUMENTS

| 4,907,039 | 3/1990 | Chikaki | 257/734 |
| 5,034,345 | 7/1991 | Shirahata | 257/737 |
| 5,046,161 | 9/1991 | Takada | 257/778 |
| 5,394,013 | 2/1995 | Oku et al. | 257/758 |
| 5,604,379 | 2/1997 | Mori | 257/738 |
| 5,631,499 | 5/1997 | Hosomi et al. | 257/737 |
| 5,656,863 | 8/1997 | Yasunaga et al. | 257/778 |
| 5,677,576 | 10/1997 | Akegawa | 257/737 |

FOREIGN PATENT DOCUMENTS

| 0 605 814 | 7/1994 | European Pat. Off. . |
| 26 37 667 | 2/1977 | Germany . |
| 63-78555 | 4/1988 | Japan | 257/737 |
| 1-122128 | 5/1989 | Japan . |
| 3-250628 | 11/1991 | Japan | 257/737 |

*Primary Examiner*—Tom Thomas
*Assistant Examiner*—Alexander Oscar Williams
*Attorney, Agent, or Firm*—Staas & Halsey

[57] ABSTRACT

A process for making a chip sized semiconductor device, in which a semiconductor chip is prepared so as to have electrodes on one of surfaces thereof and an electrically insulating passivation film formed on the one surface except for areas where the electrodes exist. An insulation sheet is prepared so as to have first and second surfaces and a metallic film coated on the first surface. The second surface of the insulation sheet is adhered on the one surface of the semiconductor chip. First via-holes are provided in the metallic film at positions corresponding to the electrodes. Second via-holes are provided in the insulation sheet at positions corresponding to the first via-holes so that the electrodes are exposed. The metallic film is electrically connected to the electrodes of the semiconductor chip through the first and second via-holes. A circuit pattern is formed from the metallic film so that the circuit pattern has external terminal connecting portions. An insulation film is adhered on the insulation sheet so that the external terminal connecting portions are exposed. External connecting terminals are electrically connected to the external terminal connecting portions of the circuit pattern.

10 Claims, 12 Drawing Sheets

SEMICONDUCTOR DEVICE HAVING AN ELEMENT WITH CIRCUIT PATTERN THEREON

BACKGROUND OF THE INVENTION

1. Field of the Invention

The present invention relates to a semiconductor device and a process for making the same. More particularly, this invention relates to a chip size semiconductor device having substantially the same dimensions as a semiconductor chip, such as an LSI chip.

2. Description of the Related Art

There has been a demand for miniaturizing a semiconductor device on which a semiconductor chip is mounted for the purpose of increasing the mounting density thereof. The miniaturization of the semiconductor device means the miniaturization of a package in which the chip is sealed. To satisfy such a demand, a chip size package or chip scale package (CSP) has recently been developed.

There are various types of CSPs, one of which is illustrated in FIGS. 33 and 34.

Reference numerals 10 and 12 denote a semiconductor chip and a ceramic substrate, respectively. The ceramic substrate 12 is shaped so as to have substantially the same size as the semiconductor chip 10. Circuit patterns 14 are formed on the ceramic substrate 12 and connected to lands (external terminals) 18 provided at predetermined positions on the lower side of the ceramic substrate 12 through via-holes 16. The semiconductor chip 10 is connected to the circuit pattern 14 via gold (Au) bumps 20 and silver-palladium (AgPd) pastes 22, and a gap between the semiconductor chip 10 and the ceramic substrate 12 is sealed with a resin 24.

According to the above-mentioned chip-size semiconductor device known in the prior art, although it is possible to achieve the miniaturization, the production cost increases because the ceramic substrate 10 and Au bumps 20 are used.

SUMMARY OF THE INVENTION

Accordingly, the present invention has been made to solve the above problems, and an object thereof is to provide a chip sized semiconductor device which has a simple structure to be easily produced at low cost.

According to an aspect of the present invention, there is provided a process for making a chip sized semiconductor device, the process comprising the following steps of:

preparing a semiconductor chip having electrodes on at least one of surfaces thereof and an electrically insulating passivation film formed on the one surface except for areas where the electrodes exist;

preparing an insulation sheet having first and second surfaces and a metallic film coated on the first surface;

adhering the second surface of the insulation sheet on the one surface of the semiconductor chip;

providing first via-holes in the metallic film at positions corresponding to the electrodes;

providing second via-holes in the insulation sheet at positions corresponding to the first via-holes so that the electrodes are exposed;

electrically connecting the metallic film to the electrodes of the semiconductor chip through the first and second via-holes;

partially removing the metallic film to form a predetermined circuit pattern so that the circuit pattern has at least external terminal connecting portions;

adhering an insulation film on the insulation sheet so that the external terminal connecting portions are exposed; and electrically connecting external connecting terminals to the external terminal connecting portions of the circuit pattern.

It is preferable that the semiconductor chip preparing step further comprises the following steps of:

providing a protective film on the one surface of the semiconductor chip to which the passivation film is formed, the protective film having such an effect as to prevent an ultraviolet beam from penetrating therethrough toward the semiconductor chip in a later step.

In another aspect of the present invention, there is provided a chip sized semiconductor device comprising:

a semiconductor chip having electrodes on at least one of surfaces thereof and an electrically insulating passivation film formed on the one surface except for areas where the electrodes exist;

a first insulation film made of a photo-sensitive resin and formed on the one surface of the semiconductor chip so that the electrodes are exposed;

a circuit pattern formed on the first insulation film so that the circuit pattern has first portions electrically connected to the electrodes of the semiconductor chip and second portions, a second insulation film formed on the circuit pattern so that the second portions of the circuit pattern are exposed; and external connecting terminals electrically connected to the second portions of the circuit pattern.

In still another aspect of the present invention, there is provided a chip sized semiconductor device comprising:

a plurality of semiconductor chips arranged side by side, each of the chips having electrodes on at least one of surfaces thereof and an electrically insulating passivation film formed on the one surface except for areas where the electrodes exist;

a first common insulation film made of a photosensitive resin and formed on the respective one surface of the semiconductor chip so that the electrodes are exposed;

circuit patterns formed on the first insulation film so that the circuit pattern has first portions electrically connected to the electrodes of the respective semiconductor chips and second portions, a second common insulation film formed on the circuit pattern so that the second portions of the circuit patterns are exposed; and external connecting terminals electrically connected to the second portions of the circuit pattern.

According to further aspect of the present invention, there is provided a process for making a chip sized semiconductor device, the process comprising the following steps:

preparing a semiconductor chip having electrodes on at least one of surfaces thereof and an electrically insulating passivation film formed on the one surface except for areas where the electrodes exist;

coating a first photo-sensitive resist on the one surface of the semiconductor chip;

conducting optical exposure and development on the first photo-sensitive resist film to provide first via-holes at positions corresponding to the electrodes to form a first insulation film from the first photo-sensitive resist film;

forming a metallic film on the first insulation film including the first via-holes;

etching the metallic film to form a circuit pattern which is electrically connected to the electrodes through the first via-holes;

coating a second photo-sensitive resist on the first insulation film including the circuit pattern;

conducting optical exposure and development on the second photo-sensitive resist film to provide second via-holes so that at least portions of the circuit pattern are exposed through the second via-holes; and electrically connecting external connecting terminals to the portions of the circuit pattern through the second via-holes.

DESCRIPTION OF THE PREFERRED EMBODIMENTS

The present invention will be described below in more detail with reference to the preferred embodiments illustrated in the attached drawings. Hereinafter, the same or corresponding parts or portions are referred by the same or corresponding reference marks or numerals throughout the several embodiments.

Figure 1:
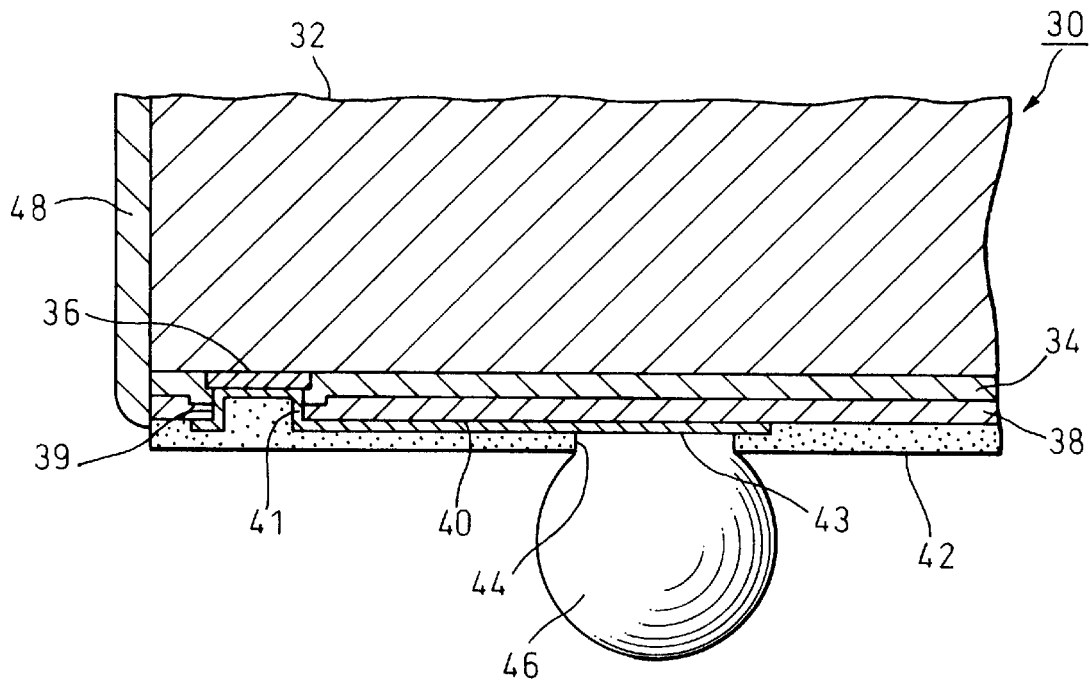
FIG. 1 is a partial cross-sectional view of a semiconductor device according to a first embodiment of the present invention.

FIG. 1 shows a side cross-sectional view of a semiconductor device 30 according to a first embodiment of the present invention, wherein reference numeral 32 denotes a semiconductor chip; 34 a passivation film formed of $SiO_2$ or the like to cover a surface of the semiconductor chip; and 36 an Al pad (pad section) which is a built-in electrode in the semiconductor chip 32. The passivation film 34 is not formed in an area where the Al pad 36 exists and is exposed. A plurality of Al pads 36 are formed on the semiconductor chip 32 in a predetermined pattern.

An insulation sheet 38, made of as mentioned, such as acrylic resin, is arranged to seal and cover the passivation film 34 of the semiconductor chip 34 by the application of pressure and heat. The insulation sheet 38 is provided with via-holes 39 at positions corresponding to the Al pads 36, which are therefore exposed.

Circuit patterns 40 are formed along a predetermined pattern on the insulation sheet 38. The circuit pattern 40 is electrically connected to the Al pads 36 through the inner walls of the via holes 39 of the insulation sheet 38 and via-holes of the passivation film 34.

The circuit pattern 40 is formed by adhering a metallic layer on the insulation sheet 38 etching the layer in conformity with a predetermined configuration, as mentioned later.

The electrical connection between the circuit pattern 40 and the Al pads 36 can be effected by filling the via-holes 39 with conductive paste (not shown in the drawings).

An electro-insulation layer 42 is formed to cover the insulation sheet 38 and the circuit patterns 40. The electro-insulation layer 42 is a protective film for the circuit patterns 40, and may be formed of various materials, such as a photosensitive solder resist.

Via-holes 44 are provided in a matrix manner at suitable positions on the electro-insulation layer 42, corresponding to the respective circuit patterns 40. Portions of the circuit pattern 40 exposed outside through the via-hole 44 form the contacts 43 to which external terminals are to be connected.

A bump 46 provides an external terminal which is electrically connected with the respective contact 43 via the via-hole 44 and bulges out from the insulation layer 42.

The bump 46 is not restricted to a sphere-shaped solder ball as illustrated in FIG. 1, but may be of any suitable shape, such as, a flat land shape or other.

A protective film 48 covers the side walls of the semiconductor chip 32, the passivation film 34 and the insulation sheet 38 for the purpose of inhibiting moisture invasion through the boundaries between the respective layers. Such a protective film 48 can be formed of any suitable resist resin, but is not indispensable to the present invention. Also, a metallic frame (not shown) may also be fixed to the semiconductor device instead of the protective film 48.

According to the above structure as mentioned with reference to the first embodiment, it is possible to obtain a semiconductor device 30 having substantially the same size as the semiconductor chip 32.

Since it is possible to reduce the thickness of the insulation sheet 38 and the insulation film 42, which are used as interposers, it is also possible to obtain a thin-size semiconductor device 30.

Since the hardness of the insulation sheet 38 and the insulation film 42 is not so high, they can function as shock-absorbing layers for protecting the surface of the semiconductor chip 32.

In this regard, the opposite surface of the semiconductor chip 32 is preferably exposed outside to enhance the heat-radiation. To further enhance the heat-radiation, a heat sink or a heat spreader (not shown) may be fixed thereon.

FIGS. 2 to 7 illustrate a process for producing a semiconductor device 30 as shown in FIG. 1.

Figure 2:
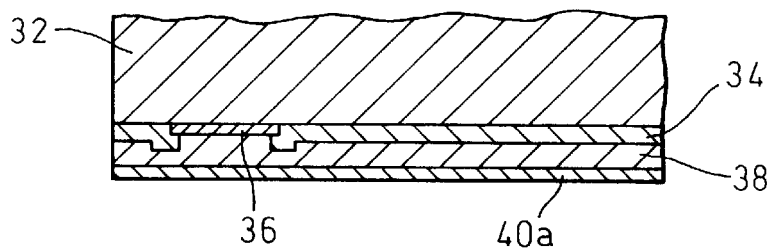
FIGS. 2 through 7 are partial cross-sectional views illustrating respective steps of a process for making a semiconductor device as shown in FIG. 1.

First, as shown in FIG. 2, a metallic layer 40a such as a copper foil is adhered onto an insulation sheet 38. Alternatively, a metallic layer may be formed on an insulation sheet 38 by a known vapor deposition process or the like. The insulation sheet 38 is provided on the first surface thereof with the metallic layer 40a and is overlapped at its second surface by heat pressing on a passivation film 34 of a semiconductor chip 32 to cover the passivation film 34 and the Al pads 36.

Figure 3:
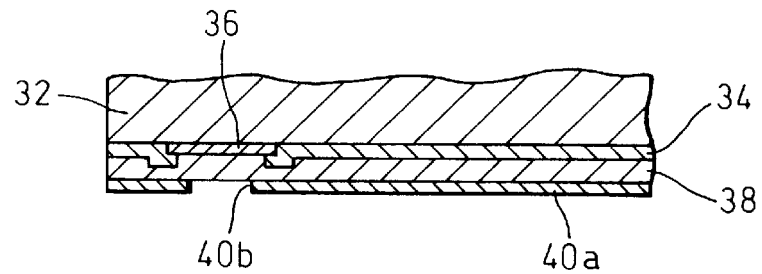

Then, a photo-resist is coated on the metallic layer 40a and a predetermined pattern is formed by a known photolithographic process. The metallic layer 40a is then etched, so that the metallic layer 40a is formed with a plurality of holes 40b at positions corresponding to the Al pads 36, as shown in FIG. 3.

Figure 4:
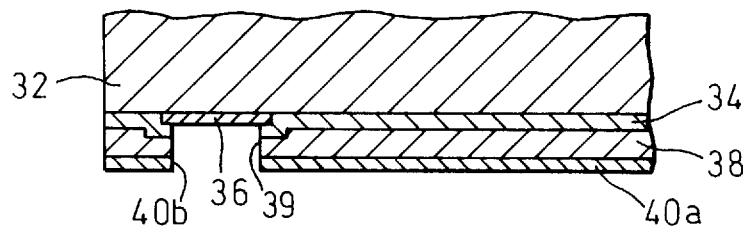

Then, as shown in FIG. 4, an etching process is conducted by using the metallic layer 40a as a masking, so that the insulation sheet 38 is formed with a plurality of via-holes 39 at positions corresponding to the holes 40b of the metallic layer 40a. The Al pads 36 are thus exposed.

Figure 5:
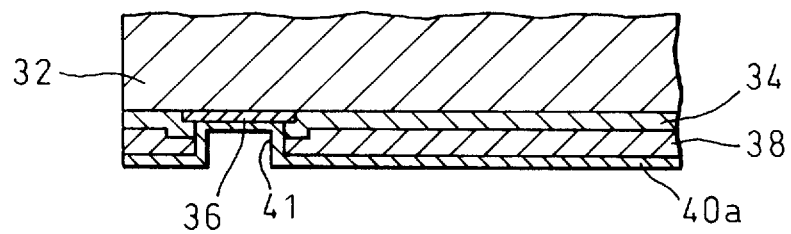

Then, as shown in FIG. 5, a metallic layer 41, such as a copper layer, is formed by electroplating or electrolessplating on the inner walls of the holes 40b, the via-holes 39 and the holes of the passivation film 34 and on the surfaces of the Al pads 36. The metallic layer 41 can also be formed by a physical process, such as vapor deposition by a sputtering process.

Figure 6:
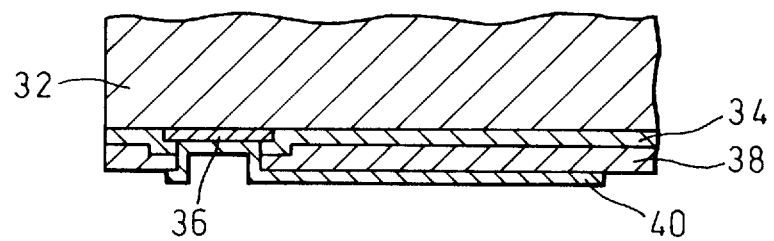

Then, a photo-resist is coated on the metallic layer 40a and a predetermined pattern is formed by a known photolithographic process. The metallic layer 40a is then etched, so that a predetermined circuit pattern 40 is thus obtained, as shown in FIG. 6.

Figure 7:
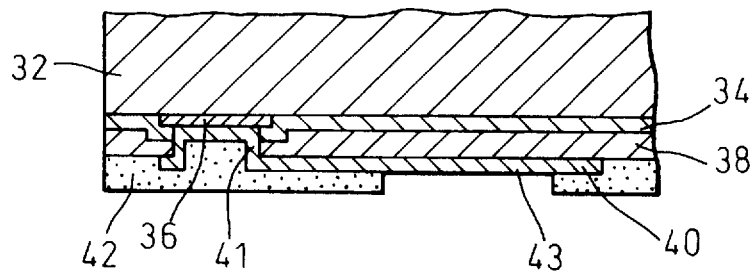

Then, a photo-resist is coated on the insulation sheet 38 to cover the circuit pattern 40 to form an insulation film 42, on which an optical exposure and development are conducted, so that portions of the photo-resist film which correspond to the above-mentioned external terminal connecting portions 43 of the circuit pattern 40 are removed, so that the circuit pattern 40 are exposed at these portions as shown in FIG. 7.

Solder balls 46 (i.e., external connecting terminals) are arranged on the external terminal connecting portions 43 and fixed onto the circuit pattern 40 through a reflow process. Alternatively, external terminal pins (not shown) can also be fixed to the terminal connecting portions 43 in place of the solder balls 46.

A semiconductor device 30 according to the first embodiment of this invention is now completed as stated above. If necessary, a resist may be coated on side walls of the semiconductor device 30 and dried to form a protective film 48 for covering the side surfaces of the semiconductor device 30.

Figure 8:
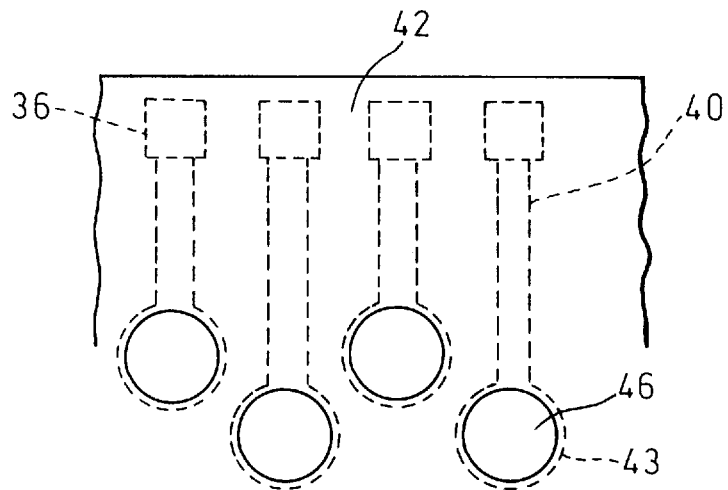
FIG. 8 is a plan view illustrating an example of an arrangement of external connecting terminals in the first embodiment is shown in FIG. 1.

FIG. 8 is a plan view illustrating an example of an arrangement of external connecting terminals 46 of the semiconductor device 30.

In the above-mentioned first embodiment, a hole forming step shown in FIG. 3 and a pattern forming step shown in FIG. 6 can simultaneously be conducted. In this case, the steps as shown in FIGS. 4 and 5 are thereafter conducted.

Also, in the step shown in FIG. 5, the electrical connection between the metallic layer 40a (or the circuit pattern 40) and the Al pads 36 can also be effected by filling the holes 39 with conductive paste in place of the plated metal.

FIGS. 9 to 19 illustrate another embodiment of a process for producing a semiconductor device. In this embodiment, a negative-type photo-resist is used to prevent the circuit formed on the semiconductor chip from being damaged when the insulation film 42 is formed by irradiation by an ultraviolet beam during the photolithographic process.

Figure 9:
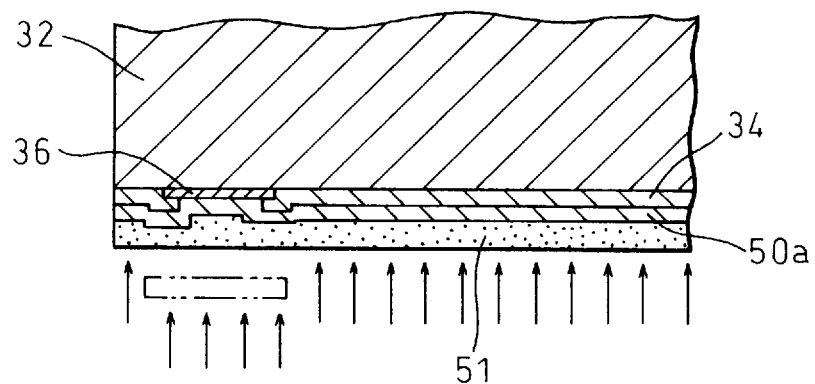
FIGS. 9 through 19 are partial cross-sectional views illustrating respective steps of a process for making a semiconductor device according to a second embodiment of the present invention.
Figure 10:
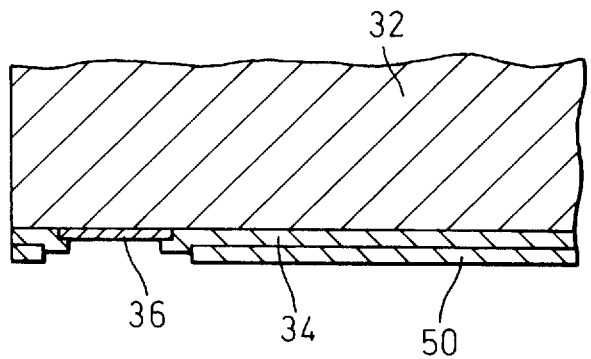

FIGS. 9 and 10 illustrate the most important steps in this embodiment, in which an ultraviolet beam shielding layer 50 is provided on the surface of the semiconductor chip 32 to shield an ultraviolet beam, used as an exposure optical source, before the insulation sheet 38 is heat-pressed onto the semiconductor chip 32.

As shown in FIG. 10, to protect the region on the surface of the semiconductor chip 32, on which the circuit pattern is formed, from the ultraviolet beam, the ultraviolet beam shielding layer 50 is formed on the passivation film 34, except for the region on which the Al pads 36 are provided.

In order to form the ultraviolet beam shielding layer 50, as shown in FIG. 9, a metallic film 50a is first formed on the passivation film 34 by a sputtering or a vapor deposition process and then a photo-resist 51 is coated thereon. If the photo-resist 51 is negative type, the portions corresponding to the Al pads 36 are shielded and then the optical exposure and the development are carried out. The photo-resist 51 on the portions corresponding to the Al pads 36 is then removed so that the metallic layer 50a is exposed. Then, the metallic layer 50a is etched and thus the ultraviolet beam shielding layer 50 is formed on the passivation film 34 (FIG. 10).

If photo-resist 51 is positive-type, an exposure method thereof is the reverse of the negative-type photo-resist 51.

In the above-mentioned photolithographic process, an ultraviolet beam is used for the exposure on the photo-resist 51. However, since the metallic layer 50a is formed on the whole surface of the passivation film 34 as an underlayer of the photo-resist 51, the ultraviolet beam is shielded by the metallic layer 50a whether the photo-resist 51 is positive-type or negative-type and therefore the circuit pattern on the semiconductor chip 32 is prevented from being damaged.

As the metallic material for the ultraviolet beam shielding layer 50, Cr is suitably used. Cr having a thickness of 0.1 $\mu$m is sufficient to stop the ultraviolet beam. In place of Cr, a metallic layer of Cu may also be used. Otherwise, a multi-layer ultraviolet beam shielding layer 50 consisting of Cr—Ni—Cu layers can also be used.

Figure 11:
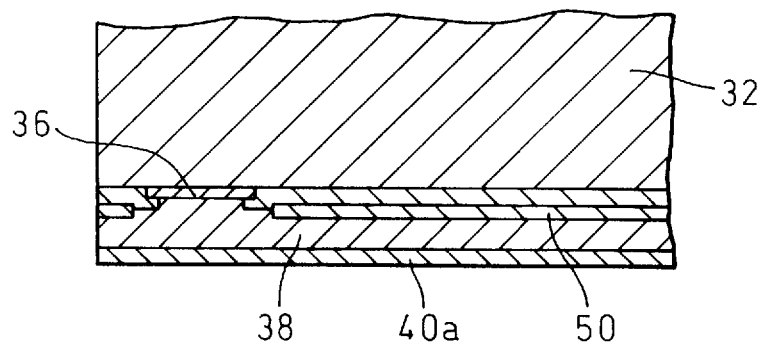
Figure 12:
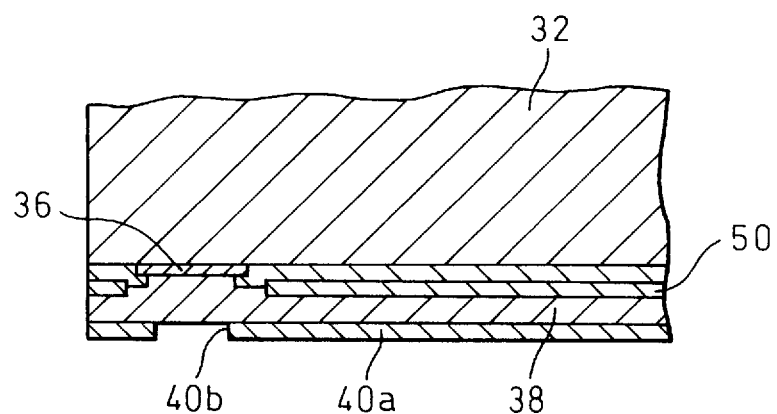

The production steps shown in FIG. 11 and thereafter are the same as those of the previous embodiment. That is, after the above-mentioned ultraviolet beam shielding layer 50 is formed, the insulation sheet 38 on which the metallic layer 40a is formed on the surface of the semiconductor chip 32 (FIG. 11).

Then, a photo-resist is coated on the metallic layer 40a and a predetermined resist pattern is formed by a photolithographic process. The metallic layer 40a is then etched, so that a plurality of holes 40b are formed. In this photolithographic process, an ultraviolet beam is exposed on the photo-resist coated on the metallic layer 40a. In this photolithographic process, however, since the metallic layer 50a is formed on the surface of the insulation sheet 38, the semiconductor chip 32 is prevented from being damaged, whichever the photo-resist 51 is positive-type or negative-type.

Figure 13:
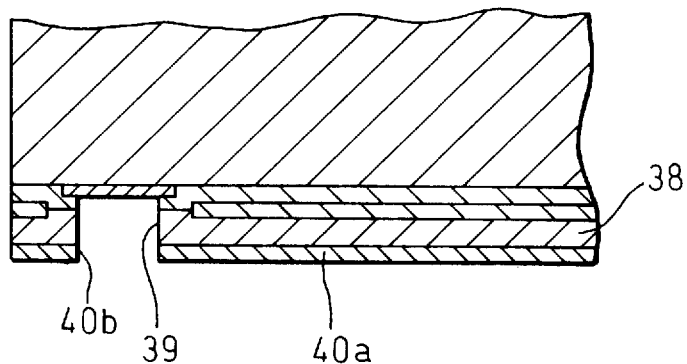

Then, an etching process is conducted by using the metallic layer 40a, having holes 40b, as a mask, so that the insulation sheet 38 is formed with a plurality of via-holes 39 at positions corresponding to the holes 40b of the metallic layer 40a, as shown in FIG. 13.

Figure 14:
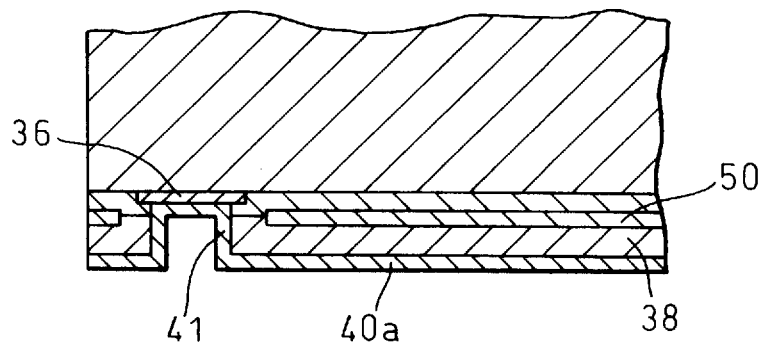

Then, a plated layer 41 is formed by electroplating or electrolessplating on the inner walls of the holes 40b, the via-holes 39 and the holes of the passivation film 34 and on the surfaces of the Al pads 36, as shown in FIG. 14.

Figure 15:
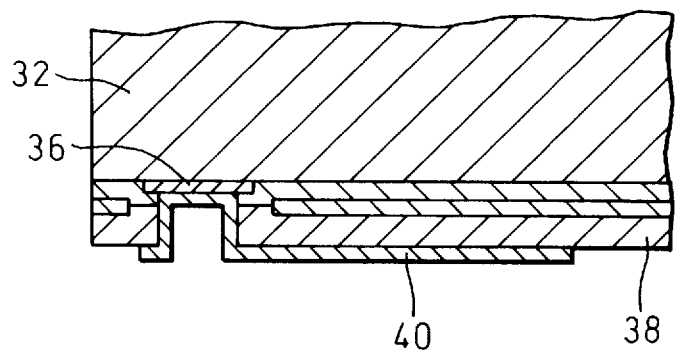

Then, a photo-resist is coated on the insulation sheet 38 to cover the circuit pattern 40 to form an insulation film 42, on which optical exposure and a development are conducted, so that portions of the photo-resist film which correspond to the above-mentioned external terminal connecting portions 43 of the circuit pattern 40 are removed, so that the circuit pattern 40 is exposed at these portions, as shown in FIG. 15. In the same manner as the above, in this photolithographic process, since the metallic layer 50a is formed on the surface of the insulation sheet 38 as an underlayer, the semiconductor chip 32 is also prevented from being damaged, whether the photo-resist 51 is a positive-type or a negative-type.

After the circuit pattern 40 is formed as mentioned above, in order to form connecting portions between the circuit pattern 40 and the external terminals, a photo-resist 42a is coated as an insulation film 42 on the insulation sheet 38 to cover the circuit pattern 40. Then, optical exposure and development are conducted on the photo-resist 42a so that the external terminal connecting portions 43 are exposed.

Figure 16:
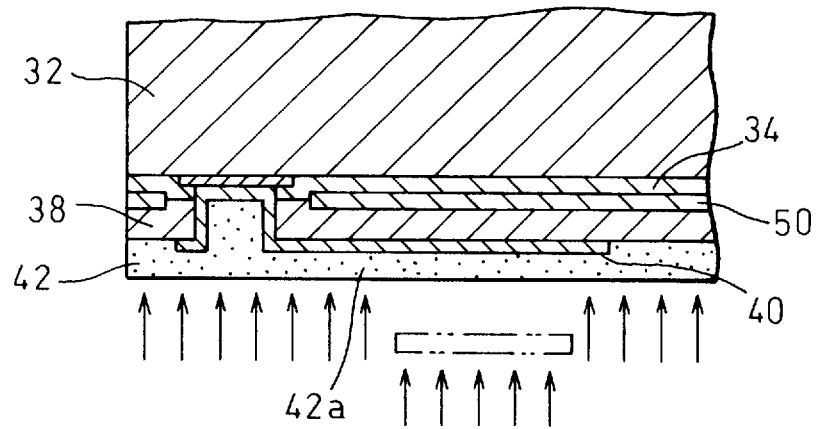
Figure 17:
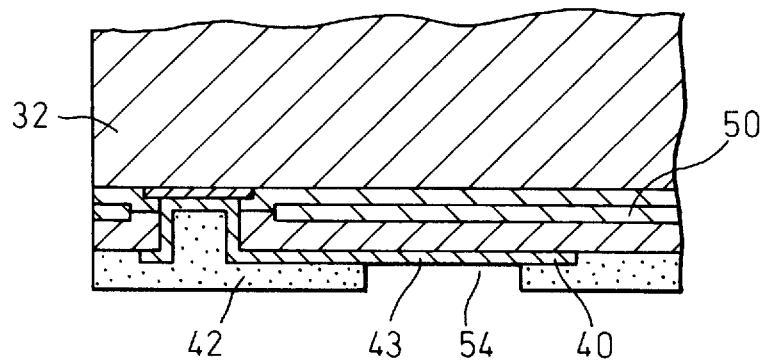

FIG. 16 shows an optical exposure process in which portions corresponding to the external terminal connecting portions 43 are shielded and FIG. 17 shows the external terminal connecting portions 43 exposed at positions of the holes of the insulation film 42, after the optical exposure and development are applied.

In FIG. 16, the photo-resist 51 for forming the insulation film 42 is negative-type. In the negative-type photo-resist 51, the portions which are not optically exposed are dissolved by a developer. Therefore, the portions corresponding to the external terminal connecting portions 43 are shielded by a masking when the ultraviolet beam is exposed.

The above-mentioned ultraviolet beam shielding layer 50 is effective to prevent damage to the circuit of the semiconductor chip 32. That is, if there was no such ultraviolet shielding layer 50 in this photolithographic process, there would be nothing to shield the respective patterns of the circuit pattern 40 when the ultraviolet beam was irradiated. Thus, the ultraviolet beam would be penetrated through the photo-resist 42b, the insulation sheet 38 and the passivation film 34 and would be irradiated onto the circuit pattern, on the surface of the semiconductor chip 32, which might be damaged.

Thus, in the former photolithographic processes, a metallic layer is formed as an underlayer to shield the whole area to which an optical beam is applied when the ultraviolet beam is irradiated to the photo-resist. However, in this photolithographic process which is conducted after the circuit pattern 40 is formed, a problem due to the optical beam may occur.

Figure 19:
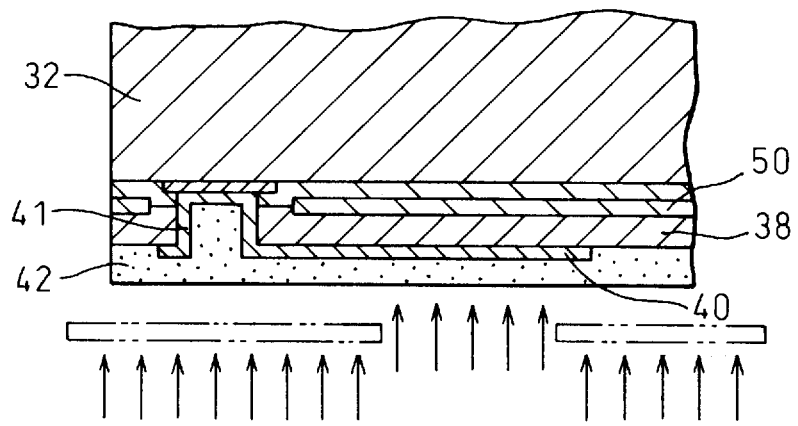

FIG. 19 shows an optical exposure method in which the positive-type photo-resist is formed on the insulation film 42. In the positive-type photo-resist, the portions which are optically exposed are dissolved by a developer. Therefore, as shown in FIG. 19, the portions other than the external terminal connecting portions 43 are shielded by a masking when the ultraviolet beam is applied. After the exposure and the development, the external terminal connecting portions 43 similar to those shown in FIG. 17 are formed.

Thus, if a positive-type photo-resist is used, the ultraviolet beam can only be irradiated to the region in which the circuit pattern 40 is formed as an underlayer and can be shielded by the circuit pattern 40. Therefore, even if no ultraviolet beam shielding layer is provided, damage to the circuit of the semiconductor chip 32 can be prevented.

Figure 18:
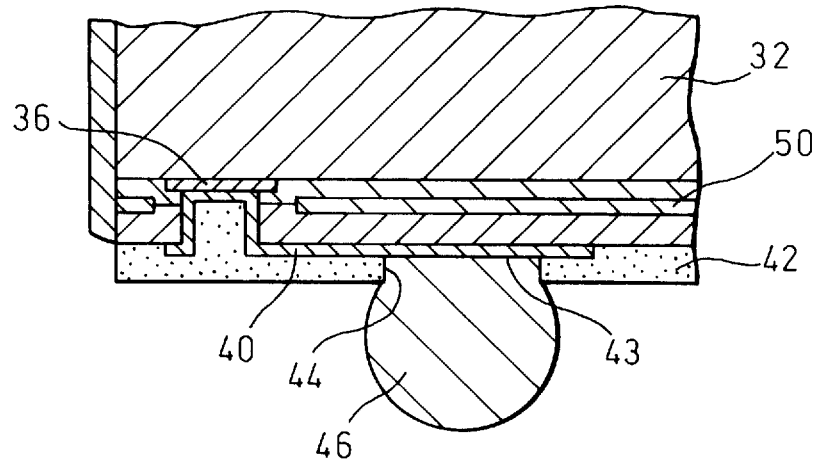

After the external terminal connecting portions 43 are exposed from the insulation film 42, solder balls 46 (i.e., external connecting terminals) are arranged on the external terminal connecting portions 43 and fixed onto the circuit pattern 40 through a reflow process. Thus, a semiconductor device can be obtained as shown in FIG. 18. If necessary, a resist may be coated on the side walls of the semiconductor device 30 and dried to form a protective film 48 for covering the side surfaces of the semiconductor device 30.

In the process for producing a semiconductor device as mentioned above with reference to FIGS. 9 to 19, since an ultraviolet beam shielding layer 50 is formed on the passivation film 34, damage to the circuit on the semiconductor chip will be prevented when the photolithographic process is conducted using a photo-resist, particularly a negative-type photo-resist.

Figure 20:
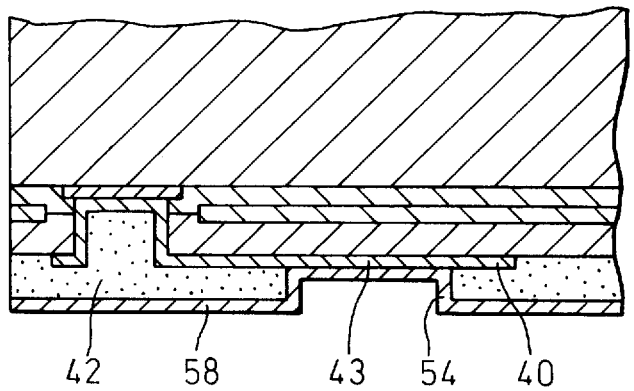
FIGS. 20 through 22 are partial cross-sectional views illustrating respective steps for forming lands in the second embodiment.
Figure 21:
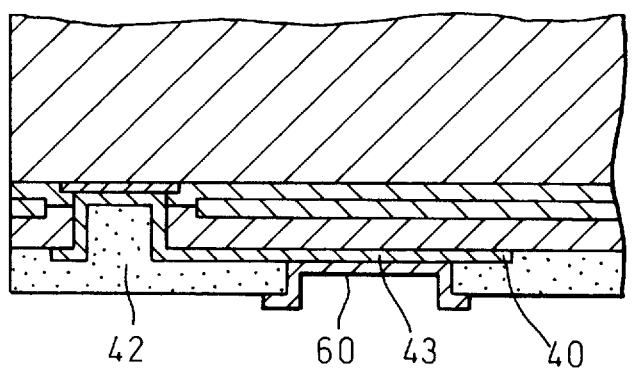
Figure 22:
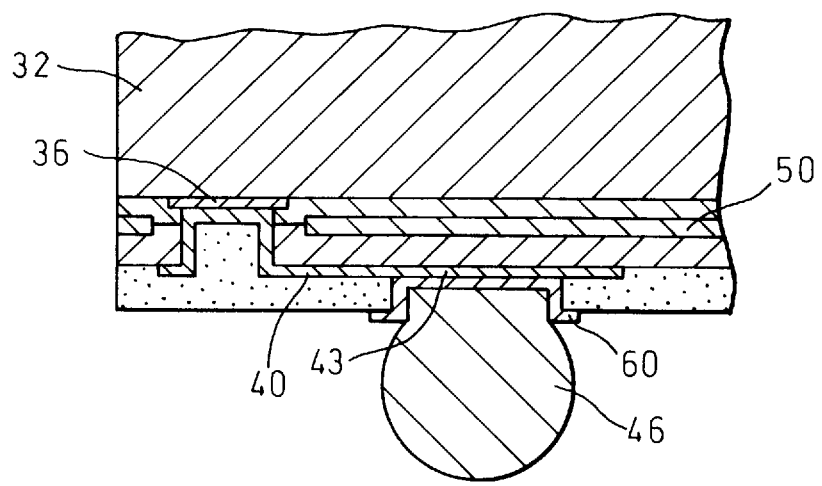

FIGS. 20 to 22 show a process for forming land portions on the inner walls of the insert holes 54 of the insulation film 42 for connecting the external connecting terminals and on the periphery of these insert holes 54 to firmly connect the external connecting terminals 46 to the external terminal connecting portions 43.

In FIG. 20, a metallic layer 58, such as a copper layer, is formed on surface of the insulation film 42 and the inner walls of the insert holes 54 by sputtering or a vapor deposition process.

Then, a photo-resist is coated on the metallic layer 58 and by a photolithographic process the photo-resist is removed except for the inner walls of the insert holes 54 and the periphery of these insert holes 54. Thus, the metallic layer 40a is etched to form the land portions, as shown in FIG. 21.

The land portions 60 are electrically connected to the external terminal connecting portions 43 at the bottom surface thereof and the inner walls of the insert holes 54 and the peripheries thereof are coated with a metallic layer.

FIG. 22 shows the external connecting terminals 46 connected to the lands 60. In the embodiment shown in FIG. 18, the external connecting terminals 46 are only connected to the external terminal connecting portions 60 of the circuit pattern 40 at the bottom surface. In this embodiment, however, the external connecting terminals 46 are connected by means of the lands 60 and therefore the external connecting terminals 46 are firmly connected to the inner surfaces of the insert holes 54 and thus are also firmly connected to the semiconductor chip 32.

In the above embodiments, although a semiconductor chip 32 formed as a single body is used, a wafer in which a plurality of semiconductor chips 32 are built-in may be used. In this case, an insulation sheet 38, a circuit pattern 40, an insulation film 42 and external connecting terminals 46 are first formed on the wafer in the similar manner as described above. Thereafter, the wafer is sliced into individual pieces to simultaneously provide a number of semiconductor devices 30 at a lower cost.

Figure 23:
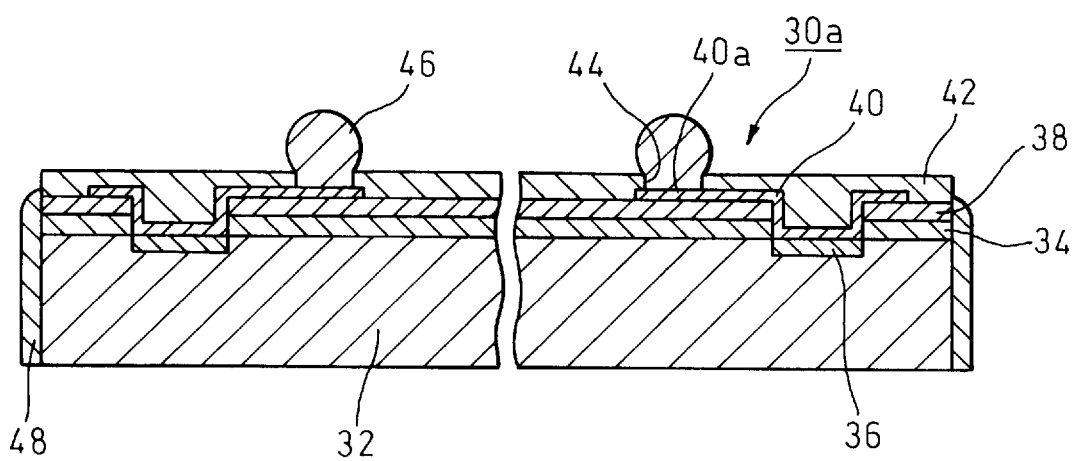
FIG. 23 is a cross-sectional view of a semiconductor device according to a third embodiment of the present invention.

FIG. 23 shows a semiconductor device according to a third embodiment of this invention, wherein reference numeral 32 denotes a semiconductor chip; 34 a passivation film formed of $SiO_2$, or the like, to cover a surface of the semiconductor chip; and 36 an Al pad (pad section) which is a built-in electrode in the semiconductor chip 32. The passivation film 34 is not formed in an area where the Al pad 36 exists and is exposed. A plurality of Al pads 36 are formed on the semiconductor chip 32 in a predetermined pattern.

A first insulation film 38, made of a photo-resist, such as a photo sensitive polyimide, is used to cover the passivation film 34 of the semiconductor chip 34. Alternatively, there is no such passivation film 34 on the semiconductor chip 32, but the first insulation film 38 can be formed to also function as the passivation film 34.

Circuit patterns 40 are electrically connected to the Al pads 36 and formed in a predetermined pattern on the first insulation sheet 38. The circuit pattern 40 is formed by forming a metallic layer, such as a Cu or Al layer, on the first insulation sheet 38 by a sputtering process and etching the metallic layer in conformity with a predetermined configuration, as mentioned later. The circuit pattern 40 can also be formed by adhering a metallic (such as Cu) layer on the first insulation sheet 38 and etching the same.

A second insulation film 42, made of a photo-solder-resist, such as photo sensitive polyimide, is formed to cover the first insulation sheet 38 and the circuit pattern 40.

Via-holes 44 are provided in a matrix manner at suitable positions on the second insulation film 42, corresponding to the respective circuit patterns 40. Portions of the circuit pattern 40 exposed outside through the via-hole 44 form external terminal connecting portions 40a.

Bumps 46 provide external terminals which are electrically connected with the respective external terminal connecting portions 40a via the via-hole 44 and bulge out from the second insulation film 42.

A protective film 48 covers the side walls of the semiconductor chip 32, the passivation film 34 and the first insulation sheet 38 for the purpose of inhibiting moisture invasion through the boundaries between the respective layers.

In the same manner as the previous embodiments, the semiconductor device 30 of this embodiment has substantially the same size as the semiconductor chip 32. It is also possible to obtain a thin-size semiconductor device 30. Since the hardness of the first and second insulation sheets 38 and 42 are not high, they can function as shock-absorbing layers for protecting the surface of the semiconductor chip 32. The opposite surface of the semiconductor chip 32 is preferably exposed outside to enhance the heat-radiation. A heat sink or a heat spreader (not shown) may be fixed thereon to enhance the heat-radiation.

Figure 24:
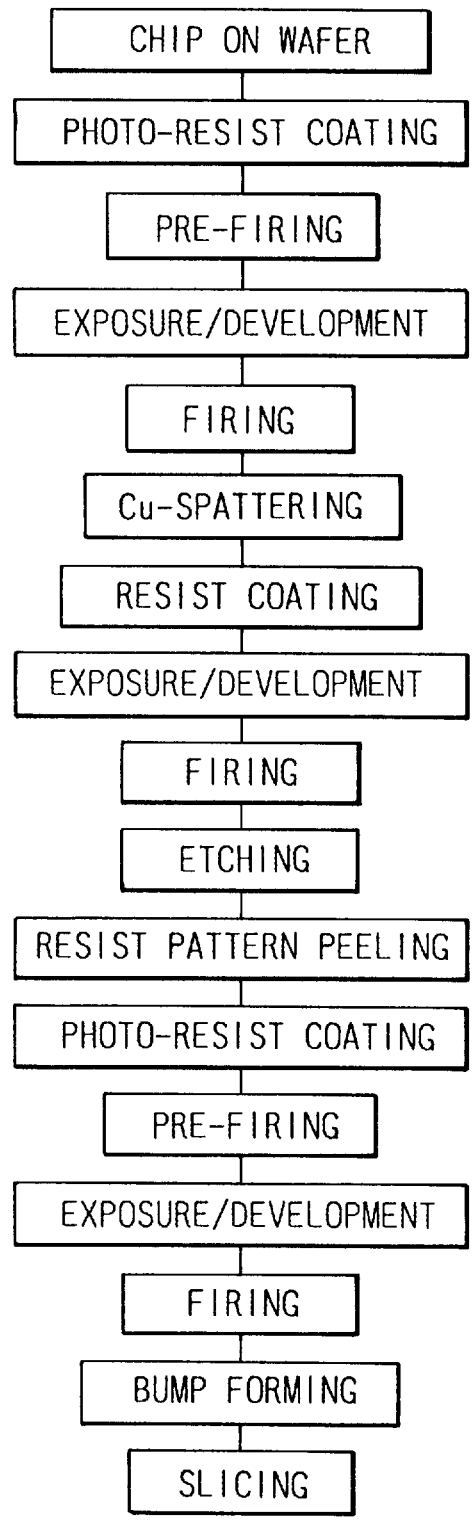
FIG. 24 is a diagram illustrating a process for making a semiconductor device as shown in FIG. 23.

FIG. 24 shows a process for making a semiconductor device as shown in FIG. 23. First, a wafer in which a plurality of semiconductor chips are made is coated with a photo-resist (photo-sensitive polyimide) to form a first insulation sheet 38.

The photo-resist is pre-fired and then an optical exposure and development are conducted by a known photolithographic process so that the photo-resist at the positions of the Al pads 36 is removed. Then the wafer is fired to form the first insulation sheet 38.

Then, a sputtering process is conducted to form a copper film on the first insulation sheet 38 and the Al pads 36 (the copper film is a conductive layer to form a circuit pattern and therefore it may be an aluminum layer). A copper may be further plated on the copper film to enhance electrical conductivity. Such a copper film may be formed by a vapor deposit process or any other process.

Then, a photo-resist is coated on the copper film and a predetermined resist pattern is formed by optical exposure, development and firing processes. Copper film is then etched using the resist pattern as a masking to obtain a circuit pattern 40. The resist pattern is then removed.

In order to form a second insulation film 42, a photo-resist (photo-sensitive solder resist) is further coated on the first insulation film 38 and the circuit pattern 40 and via holes 44 are formed by optical exposure and development.

Solder balls (i.e., bumps 46) are arranged in the via-holes 44 and fixed onto the circuit pattern 40 through a reflow process. The bumps 46 can be formed by Ni and Au plating to obtain Ni-Au bumps.

Thereafter, the wafer is sliced into individual pieces to simultaneously provide a number of semiconductor devices 30 at a lower cost. The wafer which is made as mentioned above is sliced into individual pieces to form semiconductor devices 30. If necessary, a resist may be coated on the side walls of the semiconductor device 30 and dried to form a protective film 48.

In the above embodiment, although a photo-sensitive polyimide or a photo-sensitive solder resist is used as the first and second insulation films 38 and 42, any other suitable material, such as an epoxy resin, a silicone resin or the like can be used in addition to the polyimide. Since a silicone resin has an elasticity like a rubber, it is possible to absorb the stress which might occur between the semiconductor chip and a mounting board.

Figure 25:
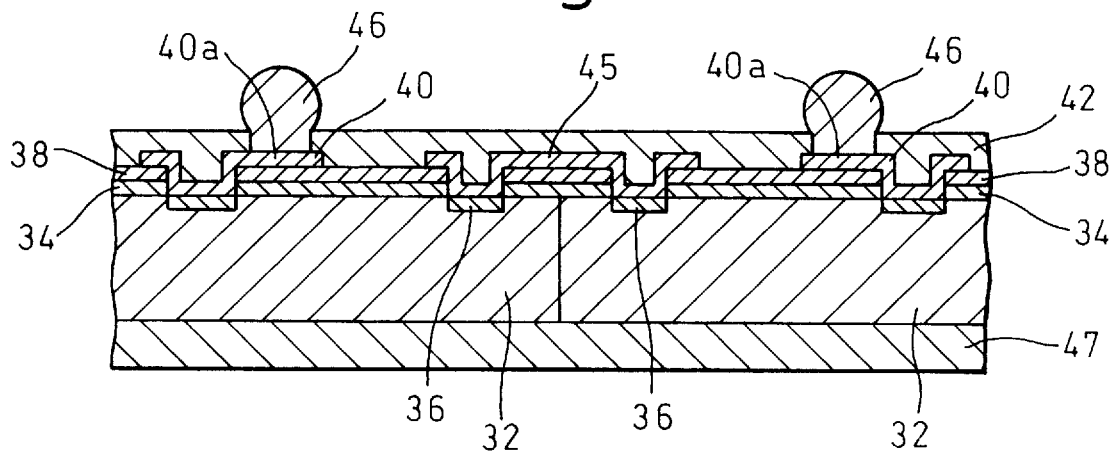
FIG. 25 is a cross-sectional view of a semiconductor device according to a fourth embodiment of the present invention.

FIG. 25 shows a semiconductor device according to a fourth embodiment of the present invention.

According to this embodiment, a plurality of semiconductor chips 32 are mounted to a common substrate 47, such as a heat spreader or the like. A first insulation sheet 38 is commonly provided on the plurality of semiconductor chips 32 in the same manner as the embodiment described above. Then, circuit patterns 40 corresponding to the respective semiconductor chips 32 and circuit patterns 45 for connecting electrodes 36 necessary for electrically connecting adjacent semiconductor chips to each other are formed in the same manner as in the embodiment described above. Thereafter, a second insulation film 42 is provided to commonly cover them, while forming bumps 46 on respective contacts 40a for the connection with external terminals of the respective circuit patterns 40.

That is, the plurality of semiconductor chips 32 are built onto a single semiconductor device 30 to form a multi-chip module.

In this embodiment, the plurality of semiconductor chips 32 may be a combination of a micro-processor unit (MPU) and a cache memory, or a series of memories.

According to this embodiment, since the plurality of semiconductor chips are mounted onto the common substrate and the electrodes thereof are electrically connected to each other via a circuit pattern, it is possible to shorten the lengths of the wires, whereby a semiconductor device (i.e. a multi-chip module) having excellent electrical properties, such as low signal delay, is obtainable. In this regard, if the plurality of semiconductor chips 32 were held by a common frame (not shown), the substrate 47 would be unnecessary. Otherwise, it is also possible to form the plurality of semiconductor chips on a common wafer.

The semiconductor device according to this embodiment can be produced through the same process as described above.

Figure 26:
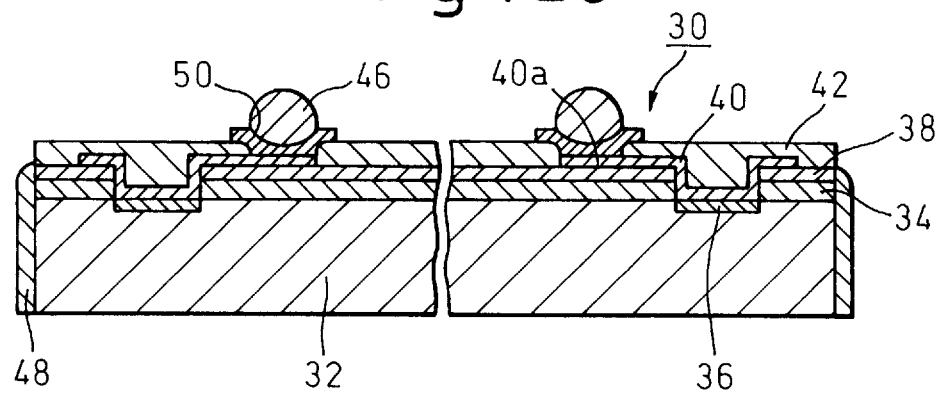
FIGS. 26 through 32 are partial cross-sectional views illustrating respective steps of a process for making a semiconductor device according to the third or fourth embodiment of this invention.

FIG. 26 shows a process for making the above-mentioned semiconductor device, in which land portions 50 are provided beforehand on the inner surface of the via-holes 44 and the periphery thereof, before solder balls (i.e., bumps 46) are arranged in the via-holes 44 and fixed onto the circuit pattern 40. To form such lands 50, after the second insulation film 42 having via-holes 44, a copper is sputtered onto the surface of the insulation film 42 to form a metallic layer, which is then etched so as to leave the inner surface and the periphery of the via-holes 44 by a photolithographic process. The bottom of land 50 is connected to the external terminal connecting portions 40a of the circuit pattern 40 and covers the inner wall and the periphery of the via-holes 44. Thus, the solder ball (bump 46) can be firmly attached to the inner portion of the via-holes 44 as compared with a case having no such land 50. Therefore, the electrical connection between the solder ball and the circuit pattern can stably be attained.

After the metallic layer is etched to form the lands 50, if a protective plated layer, such as Ni or Au, is formed thereon, the solder ball (bump 46) can be more firmly attached to the via-holes 44.

Figure 27:
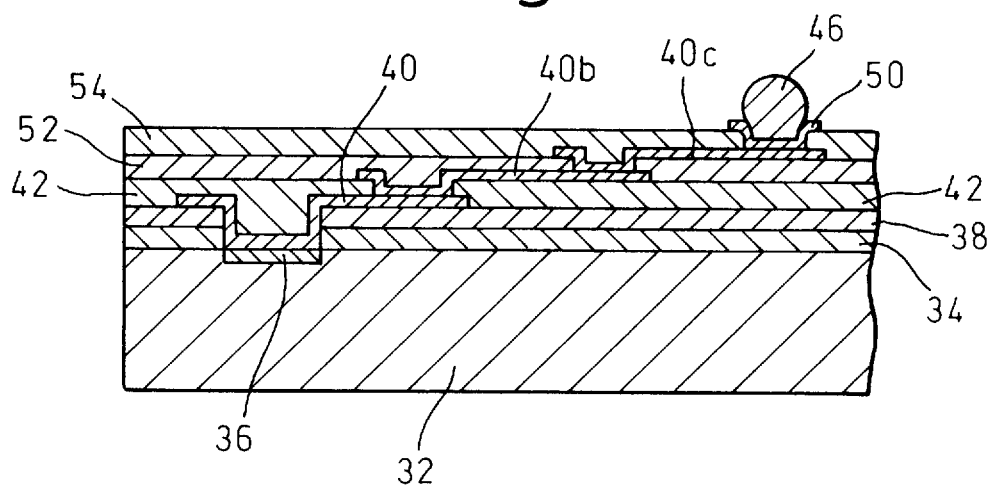

FIG. 27 shows a semiconductor device according to the present invention, in which a-multi-layer circuit patterns are formed. In this embodiment, in addition to the first and second insulation films 38 and 42, a third insulation film 42 and a fourth insulation film 54 are provided. On the surface of the second insulation film 42, a circuit pattern 40b is provided so as to be electrically connected to the circuit pattern 40 provided on the surface of the first insulation film 38. In addition, on the surface of the third insulation film 52, a circuit pattern 40c is provided so as to be electrically connected to the circuit pattern 40b. The fourth insulation film 54 is provided with lands 50 which are electrically connected to the circuit pattern 40c. Bumps 46 are connected to the lands 50.

A method for electrically connecting the respective circuit patterns to each other is the same as the connecting method between the circuit pattern 40 and the lands 50 as mentioned above. That is, to form an insulation film, a photo-resist, such as polyimide or epoxy resin, is coated and then optical exposure and development are conducted to provide via-holes at positions where the circuit pattern 40 is electrically connected. Then, a metal, such as copper, is sputtered or vapor-deposited onto the surface of the insulation film to form a metallic layer, which is then etched so as to form a circuit pattern which is electrically connected to the previous circuit pattern 40. The additional layer can be formed by exactly the same method.

In the embodiment of FIG. 27, the uppermost, fourth, insulation film 54 is provided with lands 50 to which solder balls (bumps) 46 are connected.

Figure 28:
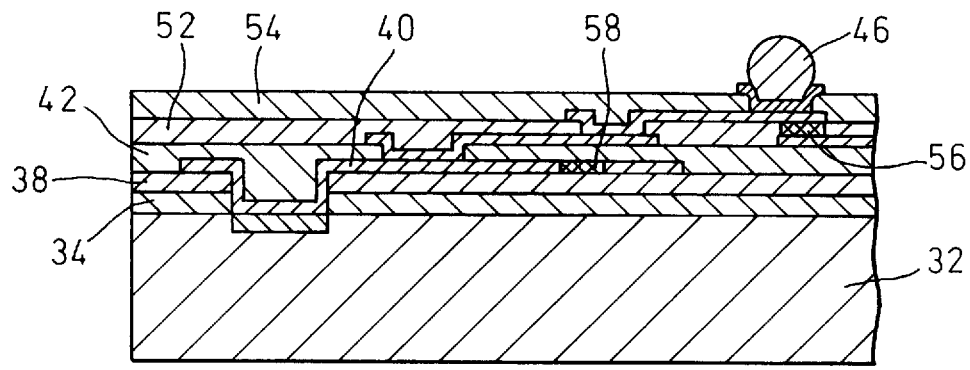

FIG. 28 shows a modified embodiment of a semiconductor device having multi-layer circuit patterns as shown in FIG. 27. In this embodiment, at least one electronic element, such as a capacitor, resister or the like, is accommodated in the layers. The electronic element, such as a capacitor, can be contained in the device during a metallic film forming process, such as a sputtering process or the like.

Figure 29:
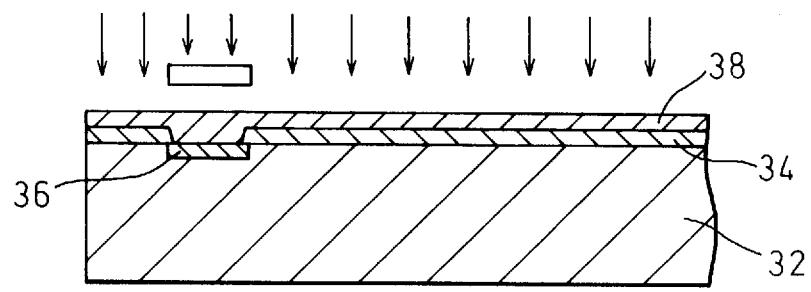

FIG. 29 shows a photolithographic process conducted on the first insulation film 38 having no ultraviolet beam shielding layer. In this case, the semiconductor chip 32 might be damaged during the photolithographic process, since an ultraviolet beam would penetrate through the first insulation film 38 toward said semiconductor chip, particularly if a negative type photo-resist was used, as mentioned in detail above.

Figure 30:
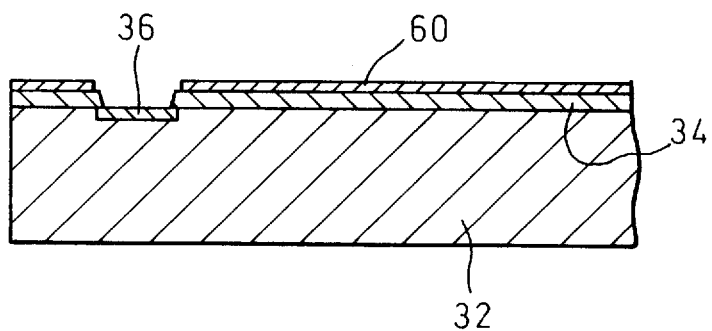

To prevent such a problem, a protective film 60 can be provided on the passivation film 34 of the semiconductor chip 32 over the area except for the positions corresponding to the Al pads 36, as shown in FIG. 30. The protective film 60 can stop an ultraviolet beam from penetrating through the protective film 60 to the semiconductor chip 32 in the photolithographic process.

The protective film 60 may be Cr layer, Cu layer, or a multi-metal layer of Cr—Ni—Cu. If Cr layer is used, it is sufficient that the thickness of Cr is 0.1 μm.

Figure 31:
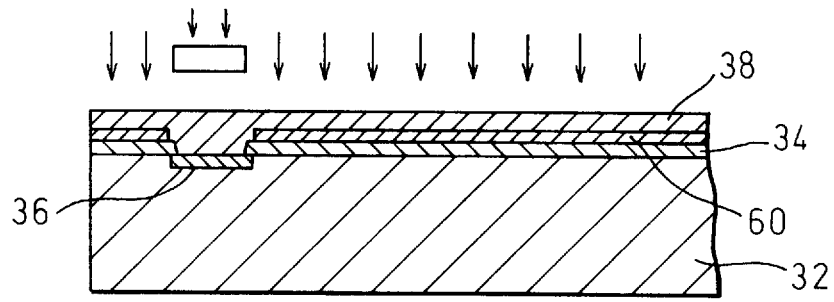

FIG. 31 shows a photolithographic process conducted on the first insulation film 38 having an ultraviolet beam shielding layer 60. In this case, the semiconductor chip 32 is not damaged during the photolithographic process, since an ultraviolet beam is stopped by the shielding protective layer 60.

Figure 32:
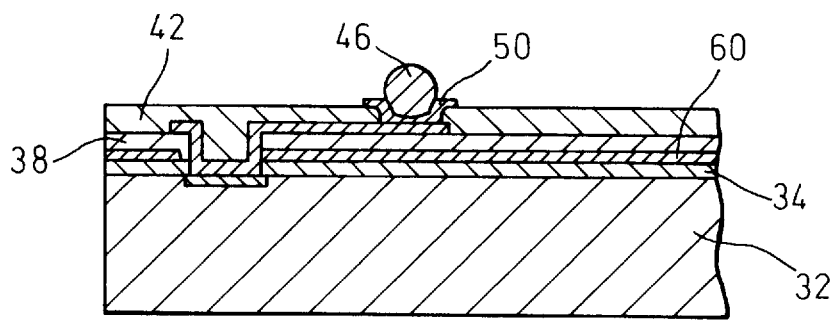
Figure 33:
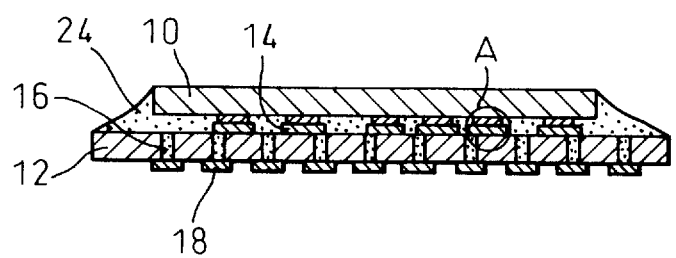
FIGS. 33 and 34 are cross-sectional and partial enlarged views of a semiconductor device conventionally known in the prior art.
Figure 34:
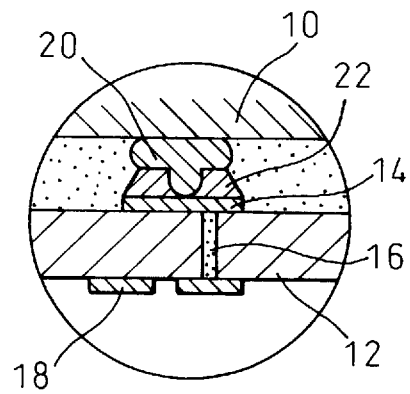

FIG. 32 shows a semiconductor device similar to that shown in FIG. 26 except that the ultraviolet beam shielding layer 60 is provided on the passivation film 34 of the semiconductor chip 32.

It should be understood by those skilled in the art that the foregoing description relates to only preferred embodiments of the disclosed invention, and that various changes and modifications may be made to the invention without departing from the spirit and scope thereof.

We claim:

1. A chip sized semiconductor device comprising:
    a semiconductor chip having electrodes on a first surface thereof and an electrically insulating passivation film formed on said first surface excluding areas where said electrodes exist;
    a first insulation film made of a photosensitive resin and formed on said passivation film so that said electrodes are exposed;
    a circuit pattern formed on said first insulation film so that said circuit pattern has first portions electrically connected to said electrodes of the semiconductor chip, and second portions;
    a second insulation film formed on said circuit pattern so that said second portions of the circuit pattern are exposed;
    external connecting terminals electrically connected to said second portions of the circuit pattern; and
    a metallic protective film formed between first surface of the semiconductor chip and said first insulation film to stop an ultraviolet beam from penetrating therethrough toward said semiconductor chip.

2. A chip sized semiconductor device as set forth in claim 1, wherein said first insulation film is made of a photosensitive polyimide.

3. A chip sized semiconductor device as set forth in claim 1, wherein said second insulation film is made of a photosensitive solder resist.

4. A chip sized semiconductor device as set forth in claim 1, wherein said external connecting terminals are electrical solder bumps.

5. A chip sized semiconductor device as set forth in claim 1, further comprising:
    a protective cover or frame; and
    a peripheral side surface of the semiconductor chip, wherein said peripheral side surface is protected by said protective cover or frame.

6. A chip sized semiconductor device as set forth in claim 1, further comprising:
    a heat spreader; and
    wherein said semiconductor chip has a second surface and said semiconductor chip is mounted on said heat spreader so that said second surface is in contact with said heat spreader.

7. A chip sized semiconductor device comprising:
    a plurality of semiconductor chips arranged side by side, each of said chips having electrodes on a surface thereof and a common electrically insulating passivation film formed on said surface excluding areas where said electrodes exist;
    a first common insulation film made of a photosensitive resin and formed on said common passivation film so that said electrodes are exposed;
    circuit patterns formed on said first common insulation film so that said circuit patterns have first portions electrically connected to said electrodes of the respective semiconductor chips, and second portions, a second common insulation film formed on said circuit patterns so that said second portions of each circuit pattern are exposed; and external connecting terminals electrically connected to said second portions of the circuit patterns.

8. A chip sized semiconductor device as set forth in claim 7, wherein said second common insulation film is made of a photo-sensitive solder resist.

9. A chip sized semiconductor device as set forth in claim 7, further comprising:

electrically conductive land portions electrically connected to said external connecting terminals; and wherein said second common insulation film has via-holes therein to expose said second portions of the circuit patterns, wherein the electrically conductive land portions are formed on a bottom, an inner wall and a periphery of respective ones of the via holes.

10. A chip sized semiconductor device as set forth in claim 7, further comprising:

a protective cover or frame, and respective side surfaces which form a common peripheral side surface protected by said protective cover or frame.

* * * * *

UNITED STATES PATENT AND TRADEMARK OFFICE
CERTIFICATE OF CORRECTION

PATENT NO.: 5,834,844
DATED : November 10, 1998
INVENTOR(S): Masatoshi AKAGAWA et al.

It is certified that error appears in the above-identified patent and that said Letters Patent is hereby corrected as shown below:

On the title page, [75], change the entirety to read:

--Inventor: Masatoshi Akagawa, Nagano, Japan--

Signed and Sealed this

Fourth Day of May, 1999

*Attest:*

*Attesting Officer*

Q. TODD DICKINSON

*Acting Commissioner of Patents and Trademarks*